(12) United States Patent
Liu et al.

(10) Patent No.: US 8,921,172 B2
(45) Date of Patent: Dec. 30, 2014

(54) JUNCTION FIELD EFFECT TRANSISTOR STRUCTURE WITH P-TYPE SILICON GERMANIUM OR SILICON GERMANIUM CARBIDE GATE(S) AND METHOD OF FORMING THE STRUCTURE

(71) Applicant: International Business Machines Corporation, Armonk, NY (US)

(72) Inventors: Xuefeng Liu, South Burlington, VT (US); Richard A. Phelps, Colchester, VT (US); Robert M. Rassel, Colchester, VT (US); Xiaowei Tian, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/264,125

(22) Filed: Apr. 29, 2014

(65) Prior Publication Data
US 2014/0235021 A1 Aug. 21, 2014

Related U.S. Application Data

(62) Division of application No. 12/983,489, filed on Jan. 3, 2011, now Pat. No. 8,754,455.

(51) Int. Cl.
| | |
|---|---|
| H01L 21/337 | (2006.01) |
| H01L 29/66 | (2006.01) |
| H01L 29/808 | (2006.01) |
| H01L 27/146 | (2006.01) |

(52) U.S. Cl.
CPC ..... *H01L 29/66916* (2013.01); *H01L 29/66462* (2013.01); *H01L 29/8086* (2013.01); *H01L 27/14679* (2013.01)
USPC ........... 438/191; 438/186; 257/192; 257/256; 257/E21.403; 257/E21.407; 257/E21.421

(58) Field of Classification Search
CPC ................... H01L 27/14679; H01L 29/66916; H01L 29/66462; H01L 29/8086
USPC .......... 438/186, 191; 257/192, 256, E21.403, 257/E21.407, E21.421
See application file for complete search history.

(56) References Cited

U.S. PATENT DOCUMENTS

| | | |
|---|---|---|
| 5,637,889 A | 6/1997 | Groover et al. |
| 5,714,777 A | 2/1998 | Ismail et al. |

(Continued)

FOREIGN PATENT DOCUMENTS

| | | |
|---|---|---|
| JP | 2008288474 | 11/2008 |

OTHER PUBLICATIONS

U.S. Appl. No. 12/983,489, Office Action Communication dated Apr. 16, 2012, 8 pages.

(Continued)

*Primary Examiner* — Kimberly Rizkallah
*Assistant Examiner* — Maria Ligai
(74) *Attorney, Agent, or Firm* — Gibb & Riley, LLC; Michael J. Lestrange, Esq.

(57) ABSTRACT

Disclosed are embodiments of a junction field effect transistor (JFET) structure with one or more P-type silicon germanium (SiGe) or silicon germanium carbide (SiGeC) gates (i.e., a SiGe or SiGeC based heterojunction JFET). The P-type SiGe or SiGeC gate(s) allow for a lower pinch off voltage (i.e., lower Voff) without increasing the on resistance (Ron). Specifically, SiGe or SiGeC material in a P-type gate limits P-type dopant out diffusion and, thereby ensures that the P-type gate-to-N-type channel region junction is more clearly defined (i.e., abrupt as opposed to graded). By clearly defining this junction, the depletion layer in the N-type channel region is extended. Extending the depletion layer in turn allows for a faster pinch off (i.e., requires lower Voff). P-type SiGe or SiGeC gate(s) can be incorporated into conventional lateral JFET structures and/or vertical JFET structures. Also disclosed herein are embodiments of a method of forming such a JFET structure.

20 Claims, 15 Drawing Sheets

(56) References Cited

U.S. PATENT DOCUMENTS

| | | | |
|---|---|---|---|
| 5,937,318 | A | 8/1999 | Warner et al. |
| 6,153,534 | A | 11/2000 | Long et al. |
| 6,730,551 | B2 | 5/2004 | Lee et al. |
| 7,745,274 | B2 | 6/2010 | Wu et al. |
| 8,466,501 | B2 | 6/2013 | Hershberger et al. |
| 2006/0197129 | A1 | 9/2006 | Wohlmuth |
| 2007/0170537 | A1 | 7/2007 | Poenar et al. |
| 2008/0258182 | A1 | 10/2008 | Agarwal et al. |
| 2008/0272395 | A1* | 11/2008 | Banna ............................ 257/190 |
| 2009/0045438 | A1 | 2/2009 | Inoue et al. |
| 2009/0101941 | A1* | 4/2009 | Ellis-Monaghan et al. .. 257/270 |
| 2009/0256174 | A1* | 10/2009 | Camillo-Castillo et al. .. 257/190 |
| 2009/0311837 | A1 | 12/2009 | Kapoor |
| 2010/0097105 | A1 | 4/2010 | Morita et al. |
| 2010/0176420 | A1 | 7/2010 | Yao |

OTHER PUBLICATIONS

U.S. Appl. No. 12/983,489, Office Action Communication dated May 24, 2012, 15 pages.

U.S. Appl. No. 12/983,489, Office Action Communication dated Jan. 7, 2013, 20 pages.

U.S. Appl. No. 12/983,489, Office Action Communication dated Feb. 15, 2013, 6 pages.

U.S. Appl. No. 12/983,489, Office Action Communication dated Sep. 6, 2013, 16 pages.

U.S. Appl. No. 12/983,489, Notice of Allowance dated Feb. 6, 2014, 9 pages.

Appendix P, "List of IBM Patents or Patent Applications Treated as Related", Apr. 28, 2014, 1 page.

* cited by examiner

JUNCTION FIELD EFFECT TRANSISTOR STRUCTURE WITH P-TYPE SILICON GERMANIUM OR SILICON GERMANIUM CARBIDE GATE(S) AND METHOD OF FORMING THE STRUCTURE

CROSS-REFERENCE TO RELATED APPLICATIONS

This application is a Divisional of U.S. application Ser. No. 12/983,489 filed Jan. 3, 2011, issued as U.S. Pat. No. 8,754,455 on Jun. 17, 2014, the complete disclosure of which, in its entirety, is herein incorporated by reference.

BACKGROUND

1. Field of the Invention

The present invention relates to junction field effect transistors (JFETs), and more specifically, to a JFET structure with one or more P-type silicon germanium or silicon germanium carbide gates and a method of forming the structure.

2. Description of the Related Art

Junction field effect transistors (JFETs) are often incorporated into integrated circuits and, particularly, into high speed portable devices, as resistors for power switching regulation. Ideally, such a JFET will have a low ON resistance (i.e., low resistance in the ON state, low Ron) and will also only require a low pinch off voltage (i.e., a low voltage to achieve the OFF state, low Voff). Unfortunately, with current JFET structures there is a trade-off between Ron and Voff as a function of channel region doping and gate doping. Specifically, doping to achieve low Ron typically results in a high Voff and vice versa. On the one hand, the problem is accentuated in vertical JFET structures formed in deep sub-micro technologies and beyond, where a deep STI is deployed as a field for isolation. Such a vertical JFETs exhibit high Voff because the P-type top gate is relatively shallow and the trench isolation structures that isolate the P-type top gate from the source/drain regions are relatively deep, thereby making pinch off of the P-type top gate to P-type bottom gate in the N-channel region difficult without a high voltage. On the other hand, heavy and deep ion implantation on the top gate typically results in a diffused tail that extends into N-channel region to compensate the doping in the channel. Therefore, there is a need in the art for a JFET structure configured to achieve both low Voff and low Ron.

SUMMARY

In view of the foregoing, disclosed herein are embodiments of a junction field effect transistor (JFET) structure with one or more P-type silicon germanium (SiGe) or silicon germanium carbide (SiGeC) gates (i.e., a SiGe or SiGeC based heterojunction JFET). The P-type SiGe or SiGeC gate(s) allow for a lower pinch off voltage (i.e., lower Voff) without increasing the on resistance (Ron). Specifically, SiGe or SiGeC material in a P-type gate limits P-type dopant out diffusion and, thereby ensures that the P-type gate-to-N-type channel region junction is more clearly defined (i.e., abrupt as opposed to graded). By clearly defining this junction, the depletion layer in the N-type channel region is extended. Extending the depletion layer in turn allows for a faster pinch off (i.e., requires lower Voff). P-type SiGe or SiGeC gate(s) can be incorporated into conventional lateral JFET structures and/or vertical JFET structures. Also disclosed herein are embodiments of a method of forming such a JFET structure.

More particularly, disclosed herein in are embodiments of junction field effect transistor (JFET). Each of these JFET embodiments can comprise an N-type channel region having a first end and a second end opposite the first end, a first side and a second side opposite the first side. Each of these JFET embodiments can further comprise N-type source/drain regions adjacent to the first and second ends of the N-type channel region and having a higher concentration of an N-type dopant than the N-type channel region. Finally, each of these JFET embodiments can comprise P-type gates (i.e., a first P-type gate and a second P-type gate) adjacent to the first and second sides of the N-type channel region, where at least one of the P-type gates comprises silicon germanium or silicon germanium carbide One exemplary JFET embodiment can comprise a lateral JFET. Specifically, this lateral JFET can comprise a substrate, an insulator layer on the substrate and an N-type semiconductor layer on the insulator layer. In this embodiment, the N-type source/drain regions can comprise N-type implant regions in the semiconductor layer and the N-type channel region can comprise a portion of the semiconductor layer separating the N-type implant regions. The N-type source/drain regions can have a higher concentration of an N-type dopant than the N-type channel region. The first P-type gate can comprise a first P-type silicon germanium layer or a first P-type silicon germanium carbide layer filling a first trench that is positioned laterally adjacent to the first side of the N-type channel region. Finally, the second P-type gate can comprise any suitable P-type semiconductor material. For example, the second P-type gate can comprise a P-type implant region adjacent to the second side of the N-type channel region. Alternatively, the second P-type gate can comprise a second P-type silicon germanium layer or a second P-type silicon germanium carbide layer filling a second trench that is positioned laterally adjacent to the second side of the N-type channel region.

Another exemplary JFET embodiment can comprise a vertical JFET. Specifically, this vertical JFET can comprise a silicon substrate with a first N-well buried therein. The first P-type gate can comprise a P-well in the substrate above and abutting the first N-well. The N-type channel region can comprise a second N-well in the substrate above and abutting the P-well. The second P-type gate can comprise a P-type silicon germanium layer or a P-type silicon germanium carbide layer filling a trench that extends vertically from the top surface of the substrate into the second N-well, where the bottom surface of the trench abuts the N-type channel region and is above and physically separated from the first P-type gate. The N-type source/drain regions can comprise N-type implant regions at the top surface of the substrate above and abutting the N-type channel region. These N-type implant regions can have a higher concentration of an N-type dopant than the N-type channel region. Additionally, the second P-type gate can be positioned laterally between these N-type implant regions and isolation structures can laterally surround each of the N-type implant regions so as to isolate them from the second P-type gate Alternatively, in this vertical JFET, the first P-type gate can comprise a first P-type silicon germanium layer or a first P-type silicon germanium carbide layer in a lower portion of a trench that extends vertically from a top surface of the substrate to the N-well. The N-type channel region can comprise an N-type silicon layer in the first trench on the first P-type gate. The second P-type gate can comprise a P-type semiconductor layer filling another trench that extends vertically to the N-type silicon layer, where this other trench has a bottom surface that abuts the N-type channel region and is above and physically separated from the first P-type gate. The P-type semiconductor layer in this case can comprise a P-type silicon layer, a second P-type silicon germanium layer or a second P-type silicon germanium carbide layer. The N-type source/drain regions can comprise N-type implant regions at the top surface of the substrate above and abutting the N-type channel region. The N-type implant regions can have a higher concentration of an N-type dopant than the N-type channel region. Additionally, the second P-type gate can be positioned laterally between these N-type implant regions and isolation structures can laterally surround each of the N-type implant regions so as to isolate them from the second P-type gate Also disclosed herein are embodiments of a method of forming a junction field effect transistor (JFET). Each of the embodiments of the method can comprise forming N-type source/drain regions adjacent to a first end of an N-type channel region and adjacent to a second end of an N-type channel region opposite the first end. The N-type source/drain regions can be formed such that they have a higher concentration of N-type dopant than the N-type channel region. Additionally, each of the method embodiments can comprise forming P-type gates adjacent to opposing sides (i.e., a first P-type gate adjacent to a first side and a second P-type gate adjacent to a second side) of the N-type channel region. These P-type gates can be formed such that at least one of them comprises silicon germanium or silicon germanium carbide One exemplary method embodiment comprises forming a lateral JFET. Specifically, this method embodiment can comprise providing a semiconductor-on-insulator (SOI) wafer comprising a substrate, an insulator layer on the substrate and an N-type semiconductor layer on the insulator layer. N-type source/drain regions can be formed by forming N-type implant regions in the N-type semiconductor layer such that the N-type implant regions are separated by a designated portion (i.e., a designated N-type channel region) of the N-type semiconductor layer and such that the N-type implant regions have a higher concentration of an N-type dopant than that designated N-type channel region. As a result, the N-type source/drain regions (i.e., the N-type implant regions) are positioned laterally adjacent to opposite ends (i.e., a first end and a second end) of the N-type channel region. To form the first P-type gate, a first trench can be formed in the N-type semiconductor layer such that it is positioned laterally adjacent to a first side of the N-type channel region. This first trench can be filled with a first silicon germanium layer or a first silicon germanium carbide layer, which can be either in-situ doped or subsequently implanted with a P-type dopant. To form the second P-type gate, any of various alternative processes can be performed. For example, a P-type implant region can be formed in the N-type semiconductor layer adjacent to the second side of the N-type channel region. Alternatively, essentially simultaneously with the forming of the first P-type gate, a second trench can be formed in the N-type silicon layer such that it is positioned laterally adjacent to the second side of the N-type channel region. This second trench, like the first trench, can be filled with a second silicon germanium layer or a second silicon germanium carbide layer, which can be either in-situ doped or subsequently implanted with a P-type dopant Another exemplary method embodiment can comprise forming a vertical JFET. Specifically, this method embodiment can comprise providing a silicon substrate. A first N-well can be formed in the substrate. Then, a first P-type gate for the junction field effect transistor can be formed by forming a P-well in the substrate above and abutting the first N-well. Next, an N-type channel region for the junction field effect transistor can be formed by forming a second N-well in the substrate above and abutting the P-well. After the N-type channel region is formed, a second P-type gate for the junction field effect transistor can be formed by forming a trench that extends vertically from the top surface of the substrate to the second N-well such that it has a bottom surface that abuts the N-type channel region and is above and physically separated from the first P-type gate. Then, the trench can be filled with a silicon germanium layer or a silicon germanium carbide layer, which is either in-situ doped or subsequently implanted with a P-type dopant. Thus, in resulting vertical JFET structure formed according to this method embodiment only the top P-type gate (i.e., only the second P-type gate) comprises silicon germanium or silicon germanium carbide.

Yet another exemplary method embodiment can comprise forming a vertical JFET. This embodiment is similar to the previously described embodiment. However, rather than forming the first P-type gate by forming a P-well, the first P-type gate can be formed by forming a first trench that extends vertically from the top surface of the substrate to the N-well below. Then, a first P-type silicon germanium layer or a first P-type silicon germanium carbide layer can be formed in the lower portion of this first trench. In this case, the N-type channel region can be formed by forming an N-type silicon layer in the first trench on the first P-type gate. Then, the second P-type gate can be formed by forming a second trench extending vertically to the N-type silicon layer such that it has a bottom surface that abuts the N-type channel region and is above and physically separated from the first P-type gate. This second trench can be filled with a semiconductor layer, which is either in situ doped or subsequently implanted with a P-type dopant. Specifically, this second trench can be filled with a silicon layer so that only the bottom gate (i.e., the first P-type gate) comprises silicon germanium or silicon germanium carbide. Alternatively, this second trench can be filled with a second silicon germanium layer or a second silicon germanium carbide layer so that both the top and bottom gates (i.e., the first and second gates) comprise silicon germanium or silicon germanium carbide.

In each of the method embodiments for forming a vertically JFET structure, N-type source/drain regions for the junction field effect transistor can be formed by forming N-type implant regions at the top surface of the substrate above and abutting the N-type channel region. These N-type implant regions can be formed so that they have a higher concentration of an N-type dopant than the N-type channel region and also so that the second P-type gate is positioned laterally between them. To isolate the second P-type gate from the N-type source/drain regions, isolation structures can be formed either before or after the N-type implant regions are formed.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

Figure 1:
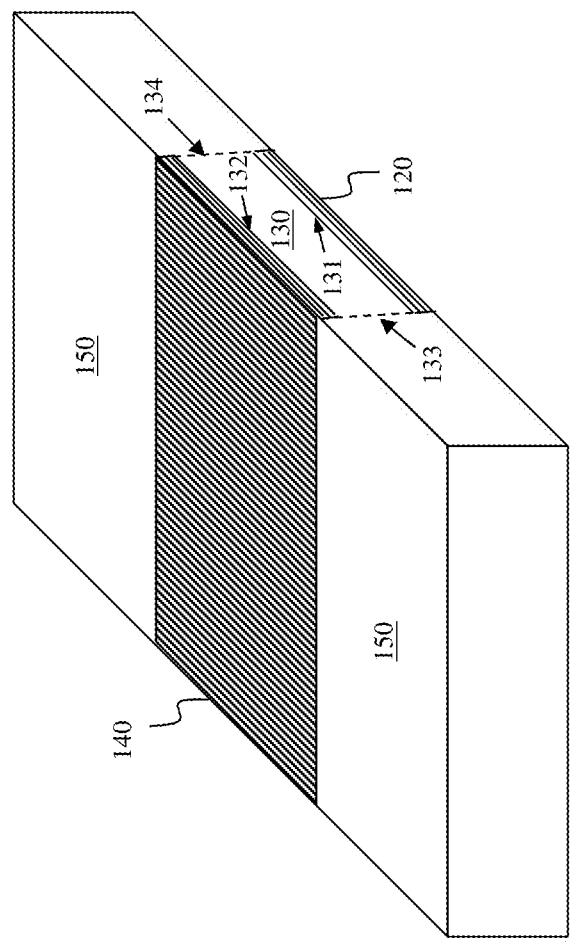
FIG. 1 is a perspective view drawing illustrating an embodiment of a junction field effect transistor (JFET)

The embodiments of the invention and the various features and advantageous details thereof are explained more fully with reference to the non-limiting embodiments that are illustrated in the accompanying drawings and detailed in the following description.

As mentioned above, junction field effect transistors (JFETs) are often incorporated into integrated circuits and, particularly, into high speed portable devices, as resistors for power switching regulation. Ideally, such a JFET will have a low ON resistance (i.e., low resistance in the ON state, low Ron) and will also only require a low pinch off voltage (i.e., a low voltage to achieve the OFF state, low Voff). Unfortunately, with current JFET structures there is a trade-off between Ron and Voff as a function of channel region doping and gate doping. Specifically, doping to achieve low Ron typically results in a high Voff and vice versa. On the one hand, the problem is accentuated in vertical JFET structures formed in deep sub-micro technologies and beyond, where a deep STI is deployed as a field for isolation. Such a vertical JFETs exhibit high Voff because the P-type top gate is relatively shallow and the trench isolation structures that isolate the P-type top gate from the source/drain regions are relatively deep, thereby making pinch off of the P-type top gate to P-type bottom gate in the N-channel region difficult without a high voltage. On the other hand, heavy and deep ion implantation on the top gate typically results in a diffused tail that extends into N-channel region to compensate the doping in the channel. Therefore, there is a need in the art for a JFET structure configured to achieve both low Voff and low Ron.

In view of the foregoing, disclosed herein are embodiments of a junction field effect transistor (JFET) structure with one or more P-type silicon germanium (SiGe) or silicon germanium carbide (SiGeC) gates (i.e., a SiGe or SiGeC based heterojunction JFET). The P-type SiGe or SiGeC gate(s) allow for a lower pinch off voltage (i.e., lower Voff) without increasing the on resistance (Ron). Specifically, SiGe or SiGeC material in a P-type gate limits P-type dopant out diffusion and, there (i.e., abrupt as opposed to grated). By clearly defining this junction, the depletion layer in the N-type channel region is extended. Extending the depletion layer in turn allows for a faster pinch off (i.e., requires lower Voff). P-type SiGe or SiGeC gate(s) can be incorporated into conventional lateral JFET structures and/or vertical JFET structures. Also disclosed herein are embodiments of a method of forming such a JFET structure.

It should be understood that in the structure and method embodiments described below a feature described as being N-type is typically doped with an N-type dopant (e.g., a Group V dopant, such as arsenic (As), phosphorous (P) or antimony (Sb)). Contrarily, a feature described as being P-type is typically doped with a P-type dopant (e.g., a Group III dopant, such as boron (B) or indium (In)).

Figure 2:
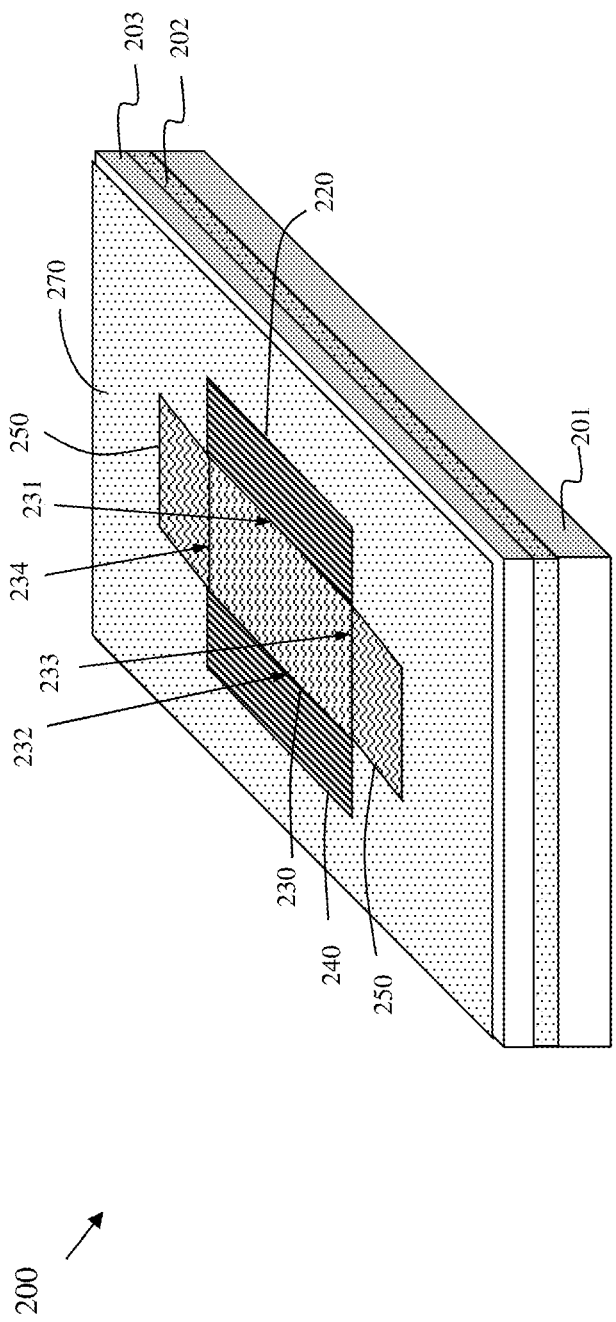
FIG. 2 is a perspective view drawing illustrating another embodiment of a JFET.
Figure 3:
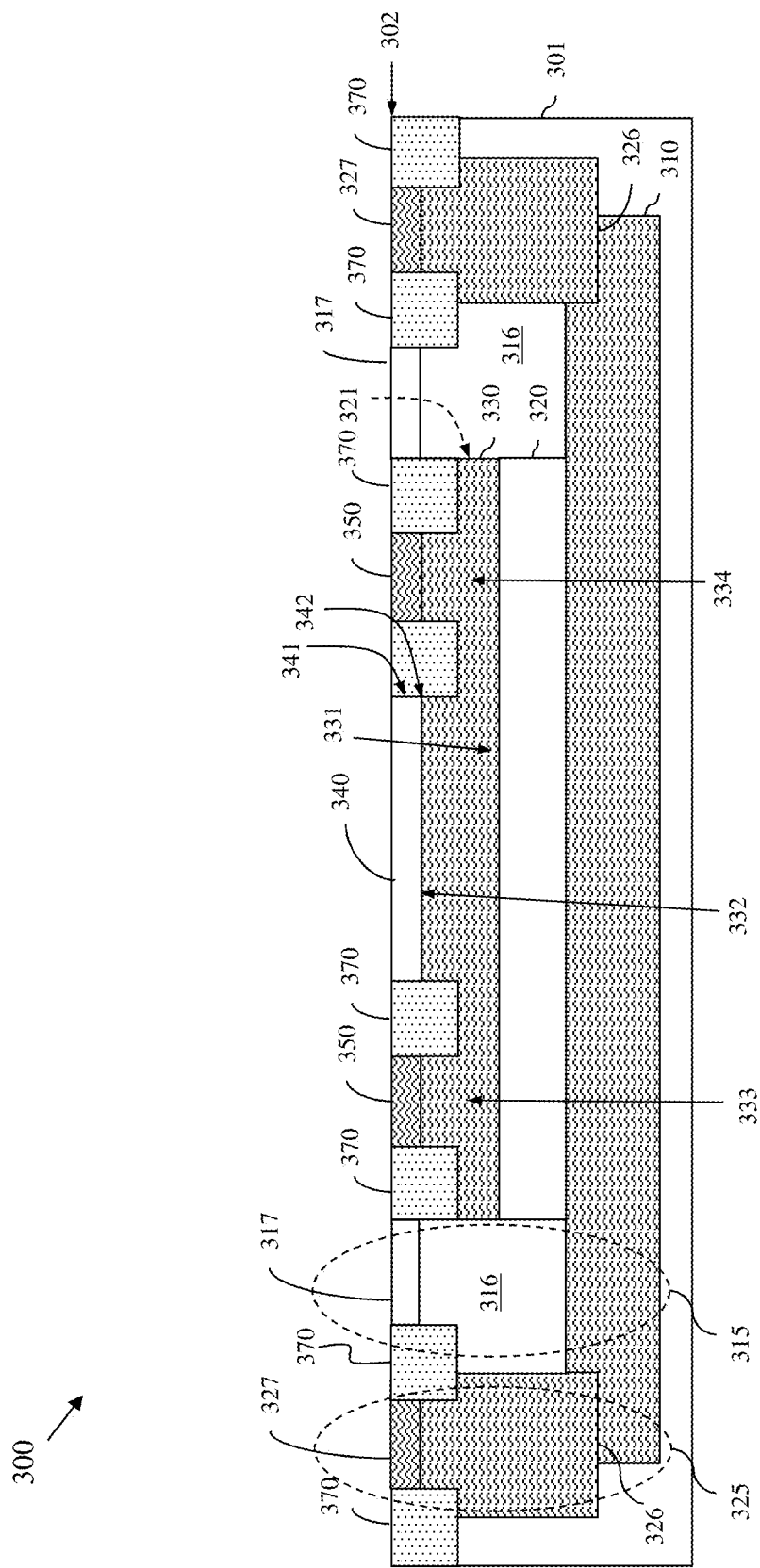
FIG. 3 is a cross-section view drawing illustrating another embodiment of a JFET.

Referring to FIGS. 1-3 illustrate three exemplary embodiments of a junction field effect transistor (JFET) 100, 200, 300 according to the present invention.

Each of these JFET embodiments 100, 200, 300 comprises an N-type channel region 130, 230, 330 having a first end 133, 233, 333 and a second end 134, 234, 334 opposite the first end 133, 233, 333 and further having a first side 131, 231, 331 and a second side 132, 232, 332 opposite the first side 131, 231, 331. The N-type channel region 130, 230, 330 can comprise, for example, a silicon layer doped with an N-type dopant.

Each of these JFET embodiments 100, 200, 300 can further comprise N-type source/drain regions 150, 250, 350 adjacent to the first end 133, 233, 333 and the second end 134, 234, 334. The N-type source/drain regions can similarly be doped with an N-type dopant, but at a higher concentration than the N-type channel region (i.e., the N-type source/drain regions can comprise N+ regions).

Finally, each of these JFET embodiments 100, 200, 300 can comprise P-type gates (i.e., a first P-type gate 120, 220, 320 and a second P-type gate 140, 240, 340) adjacent to the first and second sides of the N-type channel region. These P-type gates can comprise a semiconductor material doped with a P-type dopant. At least one of these P-type gates (i.e., the first P-type gate 120, 220, 320 and/or the second P-type gate 140, 240, 340) can comprise silicon germanium or silicon germanium carbide. The P-type SiGe or SiGeC gate(s) allow for a lower pinch off voltage (i.e., lower Voff) for the JFET 100, 200, 300 without increasing the on resistance (Ron).

Specifically, SiGe or SiGeC material in a P-type gate limits P-type dopant out diffusion from the gate(s) into the N-type channel region 130, 230, 330 and, thereby ensures that the P-type gate-to-N-type channel region junction is more clearly defined. By clearly defining this junction, the depletion layer in the N-type channel region 130, 230, 330 is extended. Extending the depletion layer in turn allows for a faster pinch off (i.e., requires lower Voff). The depletion layer (i.e., the spacer charging region) under the abrupt junction, as in the present invention, compared to the graded junction, as in the prior art can be expressed as $Xm \sim (Vd-Va)^{1/2}$ for the abrupt junction and $Xm \sim (Vd-Va)^{1/3}$ for the graded junction. Additionally, Ron is not impacted because it is typically dominated by the dopant in channel region and by side vertical resistors.

P-type SiGe or SiGeC gate(s) can be incorporated into any JFET structure (e.g., a conventional JFET structure 100 as shown in FIG. 1, a semiconductor-on-insulator (SOI) lateral JFET structure 200 as shown in FIG. 2 or a vertical JFET structure as shown in FIG. 3). Incorporating P-type SiGe or SiGeC gates into such JFET structures 100, 200, 300 has essentially no impact on the on resistance (Ron) and may provide the added benefit of imparting a desired stress on the channel region to increase charge carrier mobility.

Referring to FIG. 2, one exemplary JFET embodiment 200 can comprise a semiconductor-on-insulator (SOI) lateral JFET structure. This lateral JFET structure 200 can comprise a semiconductor substrate 201 (e.g., a silicon substrate or other semiconductor substrate), an insulator layer 202 (e.g., a silicon oxide layer or other suitable insulator layer) on the substrate 201 and a semiconductor layer 203 (e.g., a single crystalline silicon layer or other suitable semiconductor layer) on the insulator layer 102. The semiconductor layer 203 can be N-type. That is, it can be doped with an N-type dopant.

In this embodiment, the N-type source/drain regions 250 can comprise N-type implant regions in the semiconductor layer 203 and the N-type channel region 230 can comprise a portion of the semiconductor layer 203 separating the N-type implant regions. Thus, the N-type source/drain regions 250 are positioned adjacent to opposing ends (i.e., first end 233 and second end 234) of the N-type channel region 230. The N-type source/drain regions 250 can have a higher concentration of an N-type dopant than the N-type channel region 230.

Furthermore, in this embodiment, the first P-type gate 220 can comprise a first P-type silicon germanium layer or a first P-type silicon germanium carbide layer filling a first trench that is positioned laterally adjacent to the first side 231 of the N-type channel region 230. The second P-type gate 240 can comprise any suitable P-type semiconductor material. For example, the second P-type gate 240 can comprise a P-type implant region adjacent to the second side 232 of the N-type channel region 230. Alternatively, the second P-type gate 240 can comprise a second P-type silicon germanium layer or a second P-type silicon germanium carbide layer filling a second trench that is positioned laterally adjacent to the second side 232 of the N-type channel region 230.

Finally, a trench isolation structure 270 can border the edges of the N-type source/drain regions 250 and the edges of the P-type gates 220, 240 that are not adjacent to the N-type channel region 230. Thus, the n-type source/drain regions 250 and P-type gates 220, 240 are electrically isolated from each other and from other devices on the substrate 201. This trench isolation structure 270 can comprise, for example, a conventional shallow trench isolation (STI) structure comprising a trench filled with one or more isolation materials (e.g., a silicon oxide, silicon nitride, silicon oxynitride, etc.).

Referring to FIG. 3, another exemplary JFET embodiment 300 can comprise a vertical JFET. Specifically, this vertical JFET 300 can comprise a silicon substrate 301 (e.g., a P-type silicon substrate, such as a P− substrate) with a first N-well 310 buried therein.

The first P-type gate 320 can comprise a P-well in the substrate 301 above and abutting (i.e., in physical contact with) the first N-well 310. The N-type channel region 330 can comprise a second N-well in the substrate 301 above and abutting the P-well 320. The second P-type gate 340 can comprise a P-type silicon germanium layer or a P-type silicon germanium carbide layer filling a trench 341 that extends vertically from the top surface 302 of the substrate 301 into the second N-well 330 such that the bottom surface 342 of the trench 341 abuts the N-type channel region 330 and is above and physically separated from the first P-type gate 320. Additionally, the N-type source/drain regions 350 can comprise N-type implant regions in the second N-well 330 at the top surface 302 of the substrate 301 and can have a higher concentration of an N-type dopant than the second N-well 330. The second P-type gate 340 can be positioned laterally between these N-type implant regions 350.

As described above, only the second P-type gate 340 of the JFET 300 comprises silicon germanium or silicon germanium carbide. Alternatively, the first P-type gate 320 can comprise silicon germanium or silicon germanium carbide and the second P-type gate 340 can comprise silicon, silicon germanium or silicon germanium carbide.

Specifically, rather than comprising a P-well, the first P-type gate 320 can comprise a first P-type silicon germanium layer or a first P-type silicon germanium carbide layer in a lower portion of a trench 321 that extends vertically from a top surface 302 of the substrate 301 to the N-well 310 (i.e., such that it is above and abutting the N-well 310). In this case, the N-type channel region 330 can comprise an N-type silicon layer in the trench 321 on the first P-type gate 320 and the second P-type gate 340 can comprise a P-type semiconductor layer filling another trench 341 that extends vertically into the N-type silicon layer and that has a bottom surface 342 above and physically separated from the first P-type gate 320. The P-type semiconductor layer in the trench 341 can comprise a P-type silicon layer, a second P-type silicon germanium layer or a second P-type silicon germanium carbide layer. Additionally, in this case, the N-type source/drain regions 350 can comprise N-type implant regions in the N-type silicon layer 330 at the top surface 302 of the substrate 301 and can have a higher concentration of an N-type dopant than the N-type silicon layer 330. The second P-type gate 340 can be positioned laterally between these N-type implant regions 350.

Regardless of whether the first P-type gate 320, the second P-type gate 340 or both P-type gates 320, 340 comprise silicon germanium or silicon germanium carbide, the N-type source/drain regions 350 are adjacent to opposing ends (i.e., the first end 333 and second end 334) of the N-type channel region 330 and the P-type gates are adjacent to opposing sides (i.e., the first side 331 and the second side 332) of that N-type channel region 330. Additionally, the JFET 300 can comprise trench isolation structures 370 that laterally surround each of the N-type implant regions 350 so as to isolate them from the second P-type gate 340. For example, a trench isolation structure 370 can be positioned laterally adjacent to and surrounding each of the source/drain regions 350 and can extend vertically into the N-type channel region 330 to a depth at or below the depth of the bottom surface 342 of the trench 341 for the adjacent P-type gate 340. Each trench isolation structure 370 can comprise a conventional shallow trench isolation (STI) structures. That is, each STI 370 can comprise a trench filled with one or more isolation materials (e.g., a silicon oxide, silicon nitride, silicon oxynitride, etc.).

The JFET 300 can further comprise contacts 315, 325. Specifically, a first contact 315 can extend vertically from the top surface of the substrate 301 to the first P-type gate 320 to allow the first P-type gate 320 to be electrically biased. Similarly, a second contact 325 can extend vertically from the top surface to the first N-well 310 to allow the first N-well 310 to be electrically biased.

For example, the first contact 315 can comprise additional P-well 316 extending vertically from the top surface 302 to the first P-type gate 320 such that it laterally abuts the first P-type gate (i.e., such that it is positioned laterally adjacent to and in physical contact with the first P-type gate). Optionally, this additional P-well 316 can have an upper portion 317 (i.e., a well contact region) at the top surface of the substrate 301 that has a higher concentration of P-type dopant than the portion of the additional P-well 316 below.

Similarly, the second contact 325 can comprise an additional N-well 326 extending vertically from the top surface 302 to the first N-well 310. Optionally, this additional N-well 326 can have an upper portion 327 (i.e., a well contact region) at the top surface of the substrate 301 that has a higher concentration of N-type dopant than the portion of the additional N-well 326 below.

Figure 4:
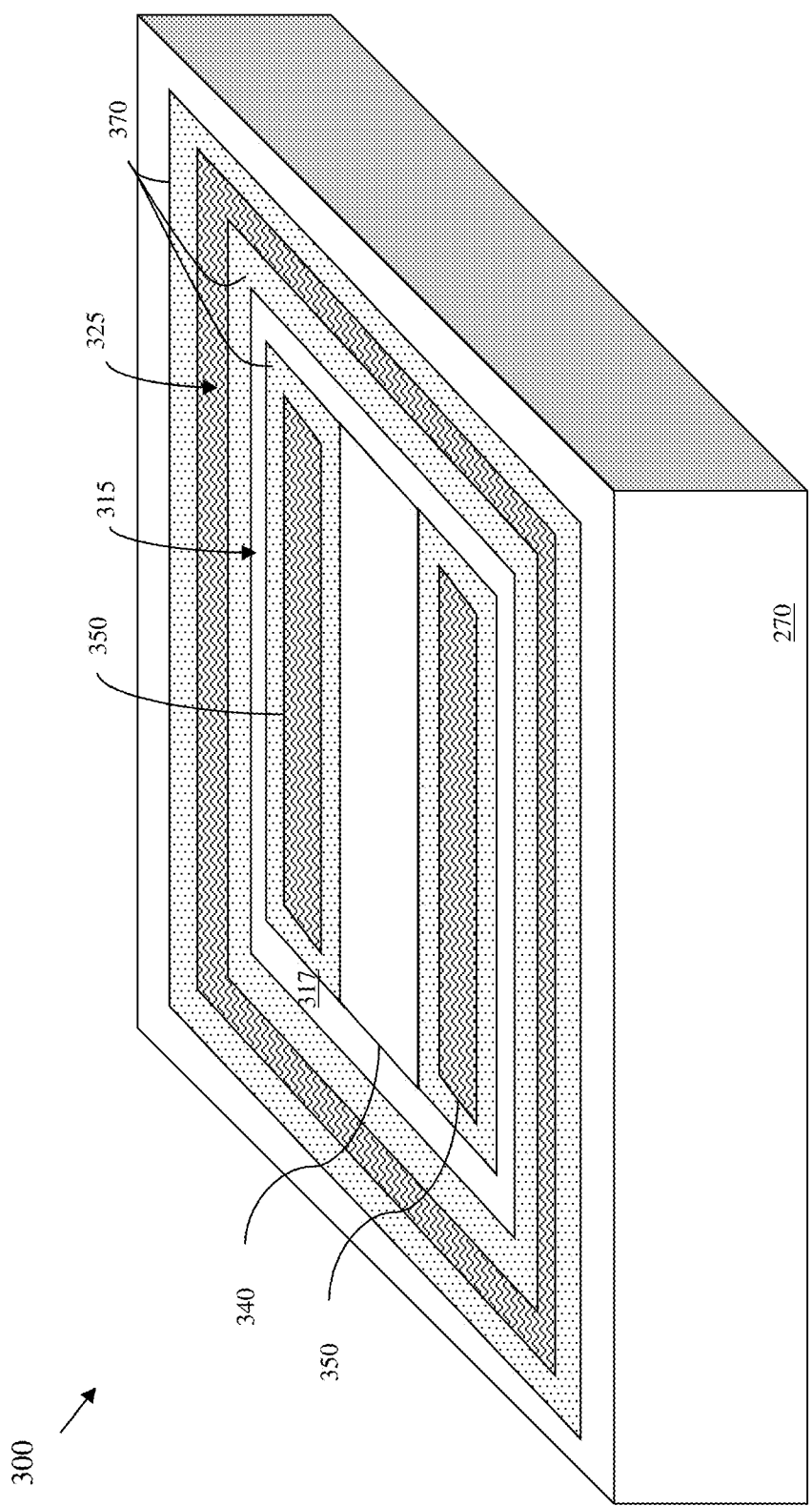
FIG. 4 is a perspective view drawing illustrating the same JFET as shown in FIG. 3.

Such contacts 315, 325 can be annular with respect to the JFET 300 and additional trench isolation structures 370 (e.g., STI structures, as described above) can isolate the highly doped P-type upper portion 317 from the highly doped N-type upper portion 327, as shown in FIG. 4. That is, the first contact 315 can border the outer edges of the first P-type gate 320, the second contact 325 can border the first contact 315 and a trench isolation structure 370 can be positioned laterally between the upper portion 317 of the first contact 315 and the upper portion 327 of the second contact. Optionally, the upper portion 317 of the first contact 315 can also abut (i.e., be in physical contact with) the second P-type gate 340, allowing the first and second P-type gates 320, 330 to be concurrently biased. Alternatively, the upper portion 317 of the first contact 315 can also be isolated (e.g., by another STI structure 370, not shown) from the second P-type gate 340 to allow the first and second P-type gates 320, 340 to be independently biased.

The exemplary configurations for the first and second contacts 315, 325, as described above, are offered for illustration purposes. It should be understood that various other vertical JFET contact configurations are well-known in the art and could alternatively be used. For example, the contacts 315, 215 could be backside contacts, could comprise different conductive materials, could be located only adjacent to a portion of the JFET (as opposed to being annular with respect to the JFET structure), could be asymmetric, etc.

Figure 5:
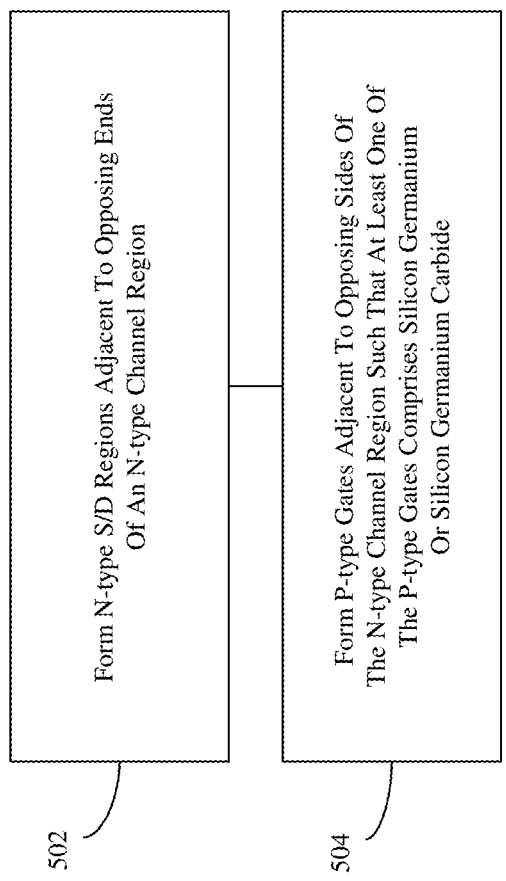
FIG. 5 is a flow diagram illustrating an embodiment of a method of forming a JFET.

Referring to FIG. 5, also disclosed herein are embodiments of a method of forming a junction field effect transistor (JFET), such as the JFETs 100, 200 and 300 shown in FIGS. 1, 2 and 3, respectively. Each of the method can comprise forming N-type source/drain regions 150, 250, 350 adjacent to opposing ends (i.e., a first end 133, 233, 333 and a second end 134, 234, 334 opposite the first end) of an N-type channel region 130, 230, 330 (502, see FIGS. 1, 2 and 3). The N-type source/drain regions 150, 350, 450 can be formed such that they have a higher concentration of N-type dopant than the N-type channel region 130, 230, 330. Additionally, each of the method embodiments can comprise forming P-type gates adjacent to opposing sides (i.e., a first P-type gate 120, 220, 320 adjacent to a first side 131, 231, 331 and a second P-type gate 120, 220, 320 adjacent to a second side 132, 232, 332 opposite the first side) of the N-type channel region 130, 230, 330. These P-type gates can be formed such that at least one of them comprises silicon germanium or silicon germanium carbide.

Figure 6:
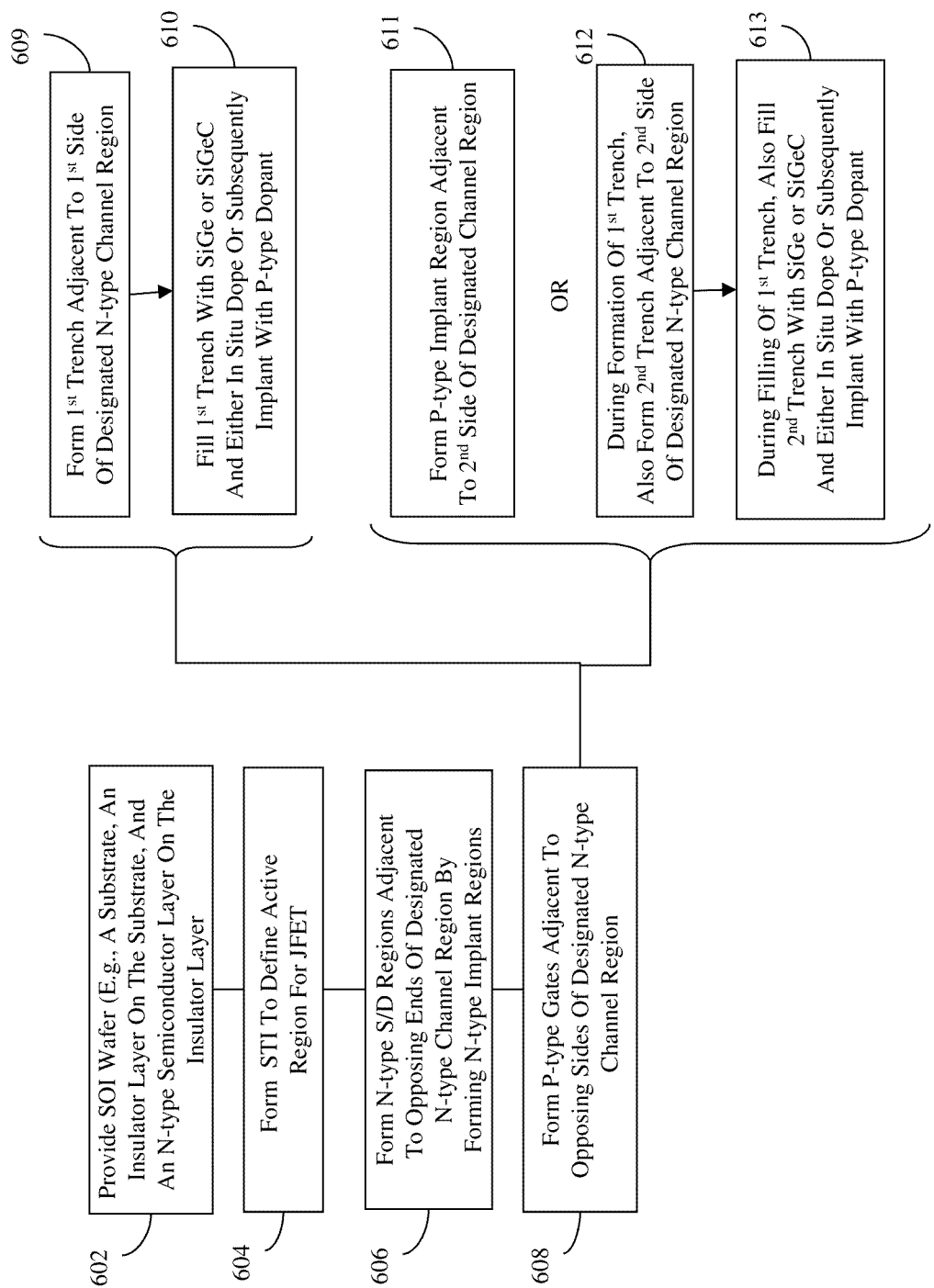
FIG. 6 is a flow diagram illustrating embodiments of a method of forming a lateral JFET as shown in FIG. 2.

Referring to FIG. 6, one exemplary method embodiment comprises forming a lateral JFET, such as the semiconductor-on-insulator (SOI) lateral JFET 200 shown in FIG. 2 and described in detail above. Specifically, this method embodiment can comprise providing a semiconductor-on-insulator (SOI) wafer (602, see FIG. 7). This wafer can comprise a semiconductor substrate 201 (e.g., a silicon substrate or other semiconductor substrate), an insulator layer 202 (e.g., a silicon oxide layer or other suitable insulator layer) on the substrate 201 and a semiconductor layer 203 (e.g., a single crystalline silicon layer or other suitable semiconductor layer) on the insulator layer 102.

Figures 7, 8:
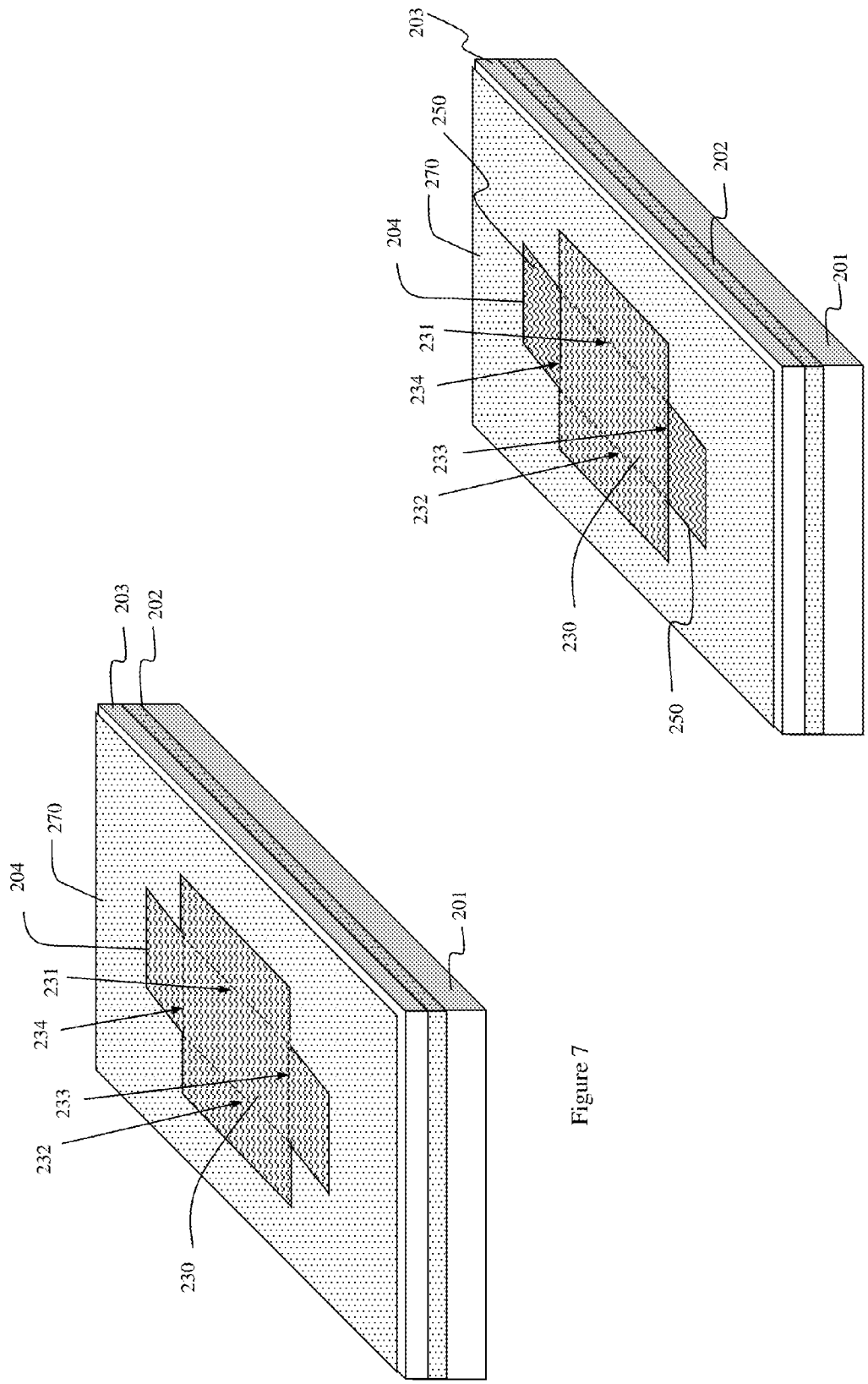
FIG. 7 is a perspective view drawing illustrating a partially completed lateral JFET structure formed according to the method of FIG. 6.
FIG. 8 is a perspective view drawing illustrating a partially completed lateral JFET structure formed according to the method of FIG. 6.

Next, a trench isolation structure 270 can be formed so as to define the active region 204 of the device 200 within the semiconductor layer 203 (604, see FIG. 7). As defined by the trench isolation region, this active region 204 can be essentially cross-shaped with portions designated for the channel region 230, source/drain regions 250 adjacent to opposing ends (i.e., a first end 233 and a second end 234 opposite the first end 233) of the channel region 230 and gates 220, 240 adjacent to opposing sides (i.e., 231, 232 of the channel region 230. The trench isolation structure 270 can be formed using, for example, conventional shallow trench isolation (STI) formation techniques. That is, a trench can be lithographically patterned into the semiconductor layer 203 stopping on the isolation layer 202. This trench can then be filled with one or more isolation materials (e.g., a silicon oxide, silicon nitride, silicon oxynitride, etc.)

It should be noted that the designated channel region 230 can be N-type. Doping of the semiconductor layer 203 and, thereby the designated channel region 230 can occur during wafer formation. Alternatively, once the active region 204 of the semiconductor layer is defined, the designated channel region 230 within the active region can be doped (e.g., using a conventional masked ion implantation process) with an N-type dopant.

N-type source/drain regions 250 can be formed in the active region 204 of the semiconductor layer 203 adjacent to the opposing ends 233, 234 of the N-type channel region 230 by forming N-type implant regions such that the N-type implant regions are separated by the N-type channel region 230 and such that the N-type implant regions have a higher concentration of an N-type dopant than that designated N-type channel region 230 (606, see FIG. 8). The N-type implant regions can be formed, for example, using conventional masked ion implantation techniques.

Figures 9A, 9B:
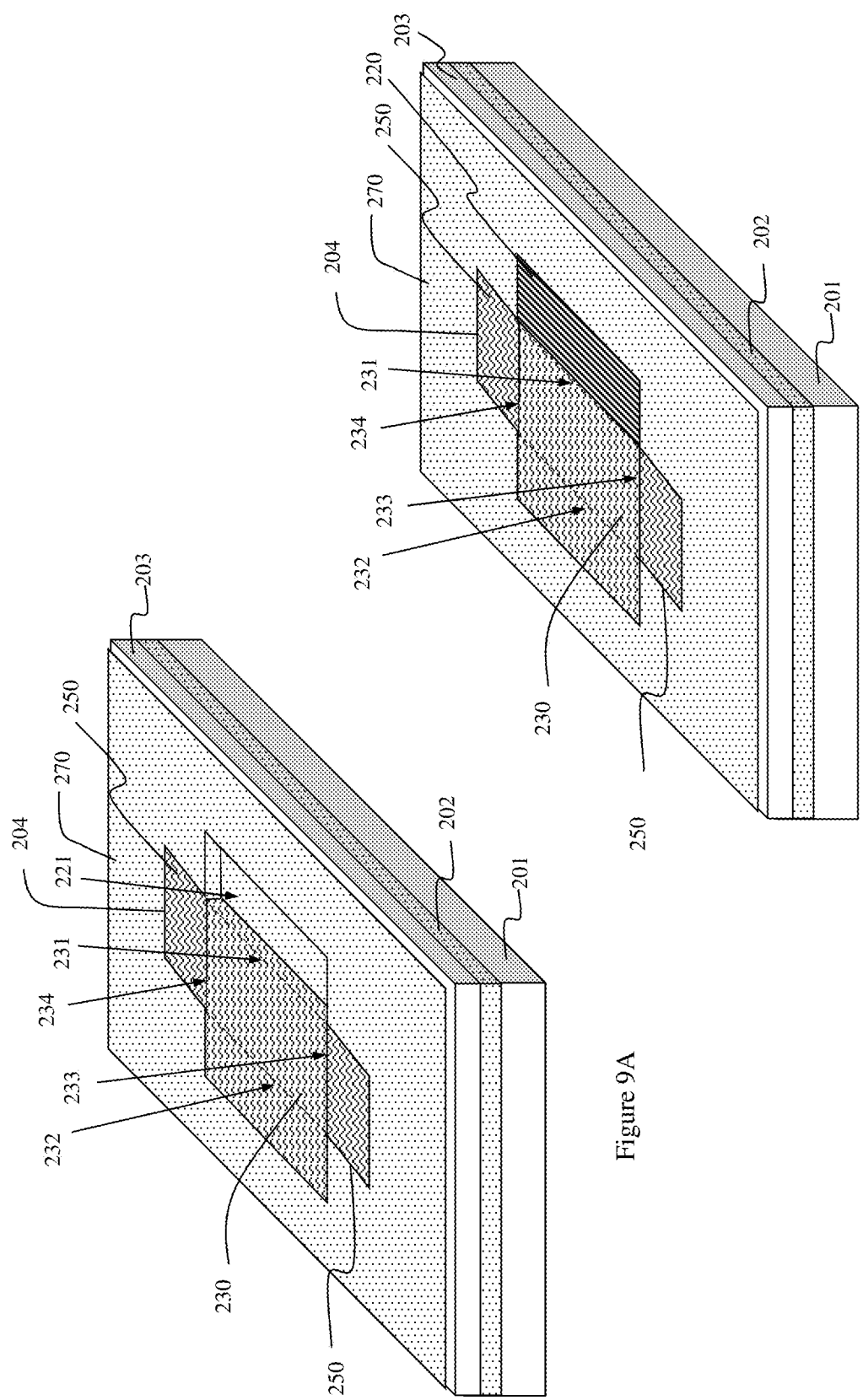
FIG. 9A is a perspective view drawing illustrating a partially completed lateral JFET structure formed according to the method of FIG. 6.
FIG. 9B is a perspective view drawing illustrating a partially completed lateral JFET structure formed according to the method of FIG. 6.

Additionally, P-type gates 220, 240 can be formed in the active region 204 of the semiconductor layer 203 adjacent to opposing sides 231, 232 of the N-type channel region 230. Specifically, to form a first P-type gate, a first trench 221 can be formed (e.g., patterned and etched using conventional lithographic patterning techniques) in the N-type semiconductor layer 203 such that it is positioned laterally adjacent to a first side 231 of the N-type channel region 230 (609, see FIG. 9A). This first trench 221 can then be filled (e.g., by epitaxial deposition) with a first silicon germanium layer or a first silicon germanium carbide layer (610, see FIG. 9B). The first trench fill material can be either in-situ doped or subsequently implanted with a P-type dopant so as to form the first P-type gate 220. To form the second P-type gate 240, any of various alternative processes can be performed.

Figure 10:
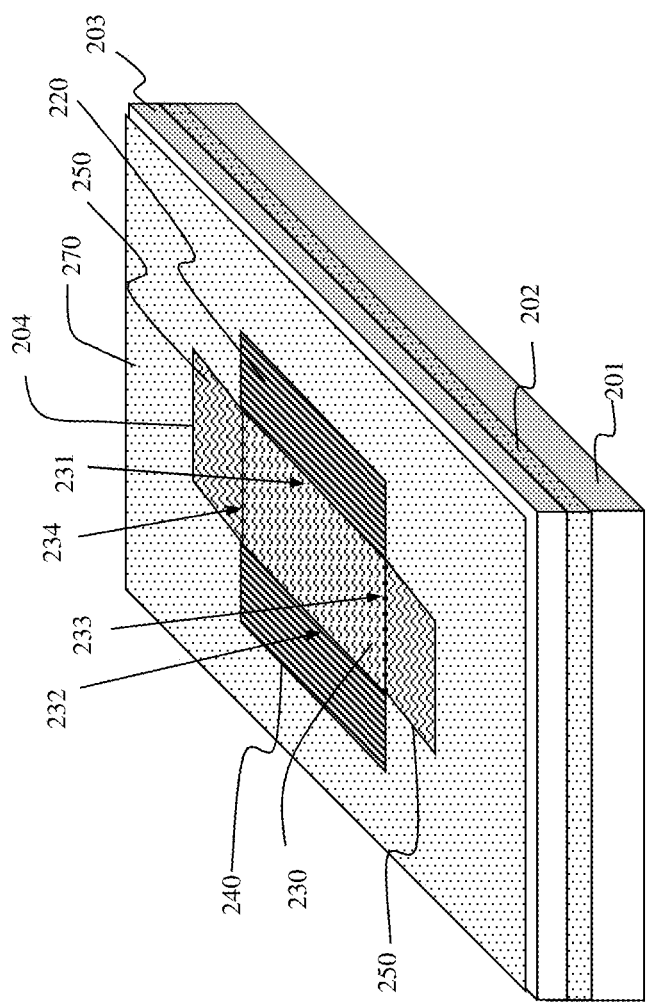
FIG. 10 is a perspective view drawing illustrating a partially completed lateral JFET structure formed according to the method of FIG. 6.
Figures 11A, 11B:
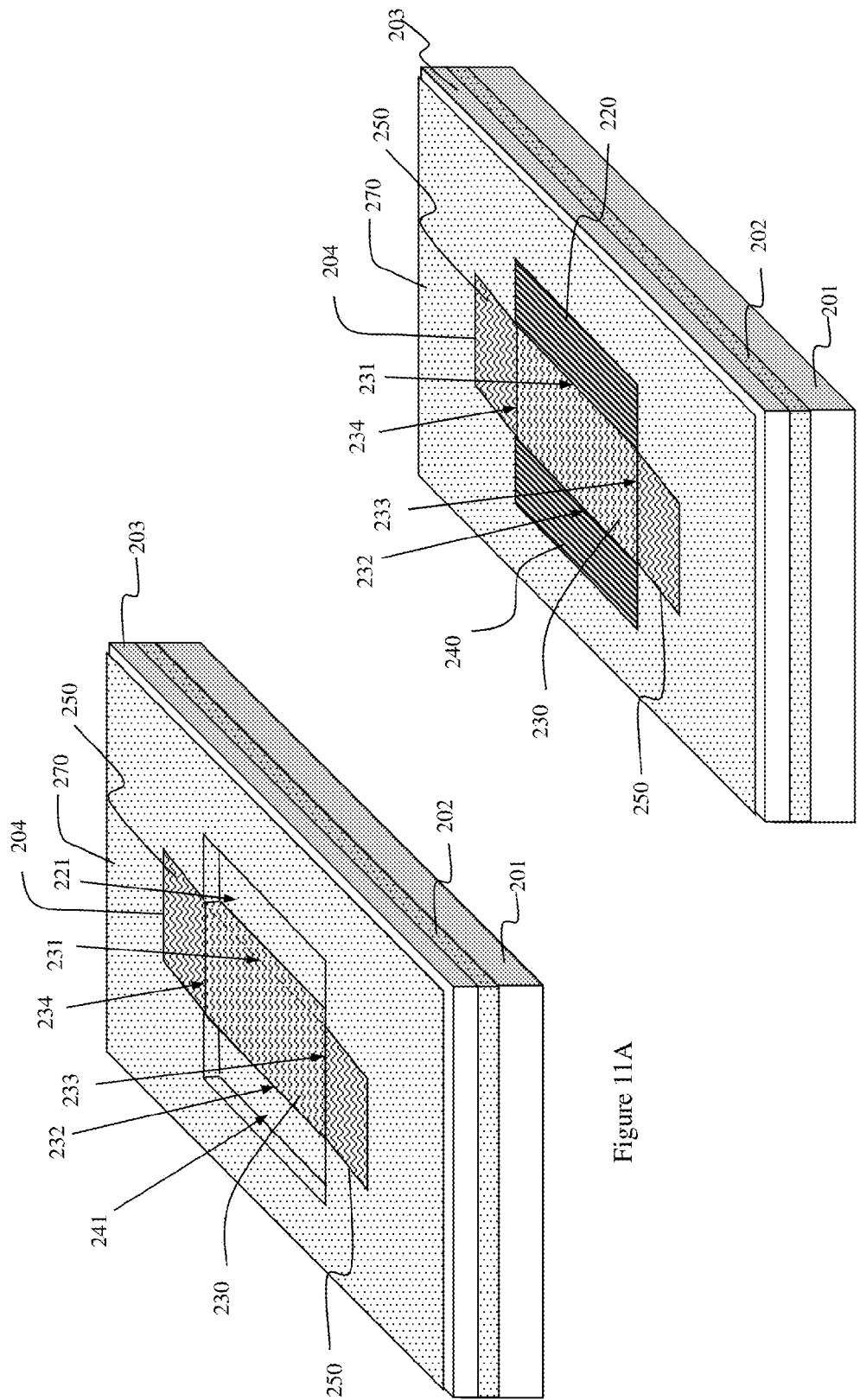
FIG. 11A is a perspective view drawing illustrating a partially completed lateral JFET structure formed according to the method of FIG. 6.
FIG. 11B is a perspective view drawing illustrating a partially completed lateral JFET structure formed according to the method of FIG. 6.

For example, a P-type implant region can be formed in the N-type semiconductor layer adjacent to the second side 232 of the N-type channel region 230 (611, see FIG. 10). In this case, only one of the P-type gates (i.e., the first P-type gate 220) will comprise silicon germanium or silicon germanium carbide. Alternatively, essentially simultaneously with the forming of the first P-type gate 220, a second trench 241 can be formed (e.g., patterned and etched using conventional lithographic patterning techniques) in the N-type silicon layer 203 such that it is positioned laterally adjacent to the second side 232 of the N-type channel region 230 (612, see FIG. 11A). This second trench 241, like the first trench 221, can be filled with a second silicon germanium layer or a second silicon germanium carbide layer, which can be either in-situ doped or subsequently implanted with a P-type dopant to form the second P-type gate 240 (612, see FIG. 11B). In this case, both of the P-type gates (i.e., the first P-type gate 220 and the second P-type gate 240) will comprise silicon germanium or silicon germanium carbide.

Figure 12:
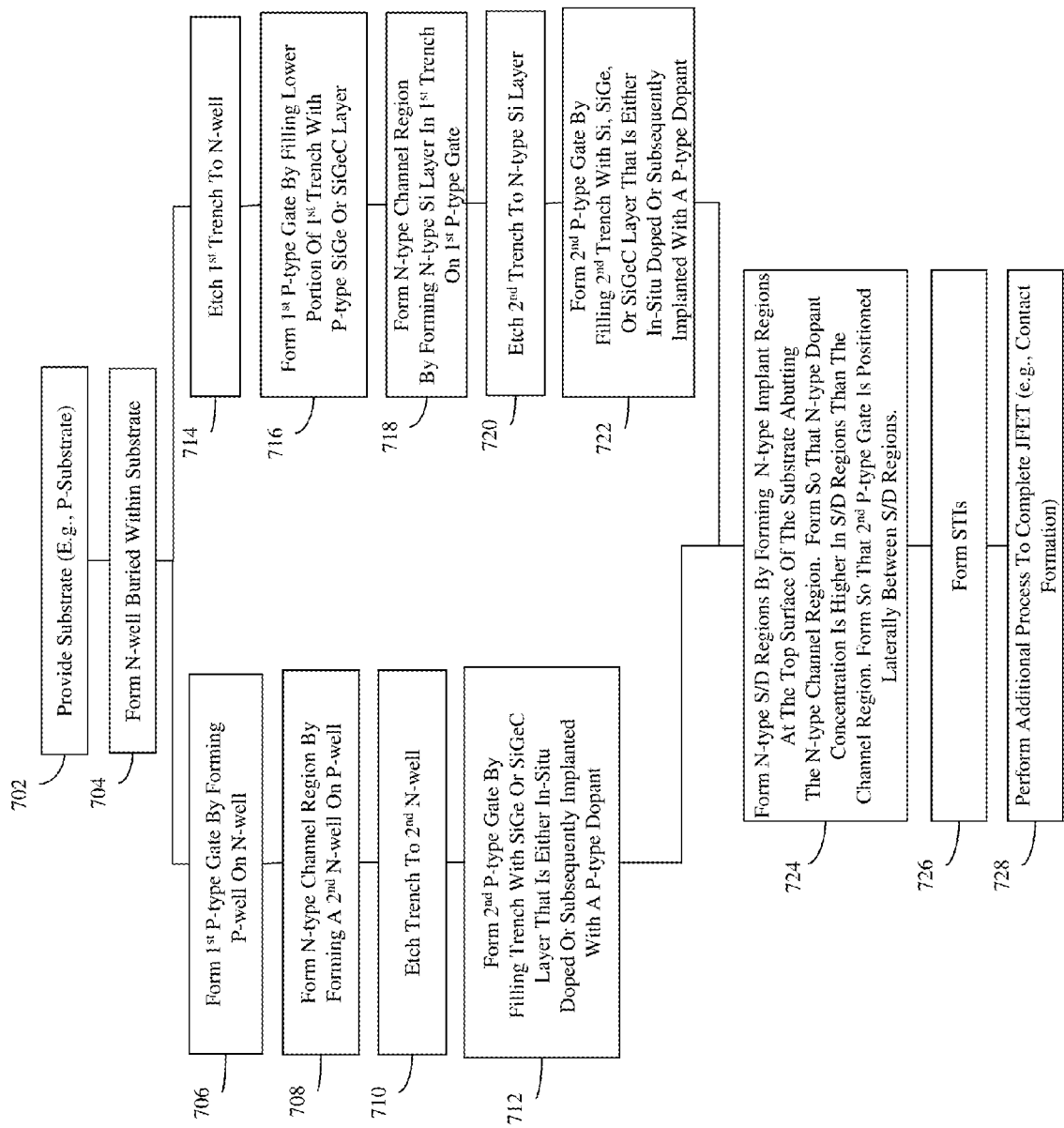
FIG. 12 is a flow diagram illustrating embodiments of a method of forming a vertical JFET as shown in FIG. 3.

Referring to FIG. 12, another exemplary method embodiment can comprise forming a vertical JFET, such as the vertical JFET 300 shown in FIG. 3 and described in detail above. Specifically, this method embodiment can comprise providing a silicon substrate (e.g., a P– bulk silicon substrate) (702).

Figure 13:
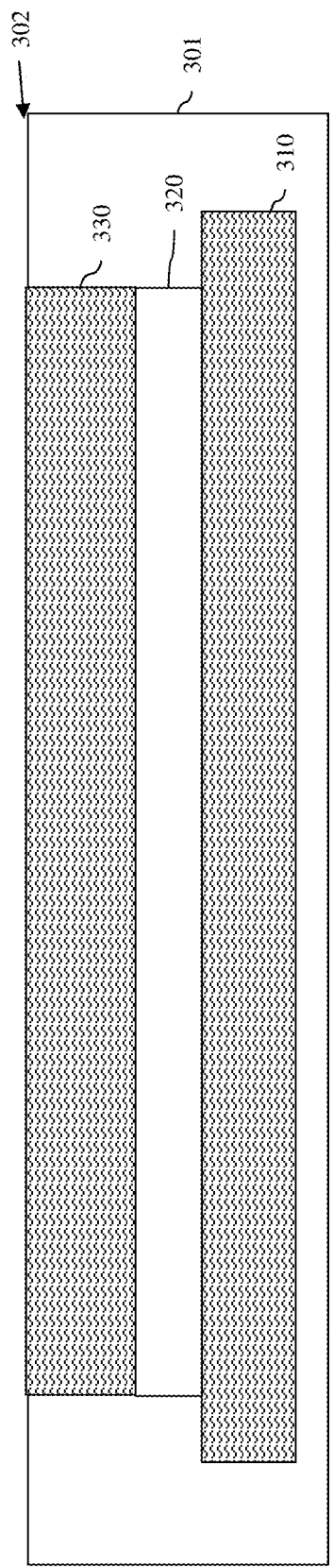
FIG. 13 is a cross-section view drawing illustrating a partially completed vertical JFET structure formed according to the method of FIG. 12.

A first N-well 310 can be formed in the substrate 301 (704, see FIG. 13). Specifically, a conventional masked ion implantation process can be performed in order to form the N-well 310 buried a predetermined depth within the substrate 301. Then, a first P-type gate 320 for the junction field effect transistor 300 can be formed by forming a P-well within the substrate 301 above and abutting (i.e., in physical contact with) the first N-well 310 (706, see FIG. 13). As with the N-well 310, this P-well can be formed using a conventional masked ion implantation process. Next, an N-type channel region 330 for the junction field effect transistor 300 can be formed by forming a second N-well in the substrate 300 above and abutting the P-well 320 (708, see FIG. 13). As with the first N-well 310 and the P-well 320, the second N-well 330 can be formed using a conventional masked ion implantation process. Those skilled in the art will recognize that the ion implantation energies used during these ion implantation processes will vary in order to ensure well formation at the desired depths.

Figure 14:
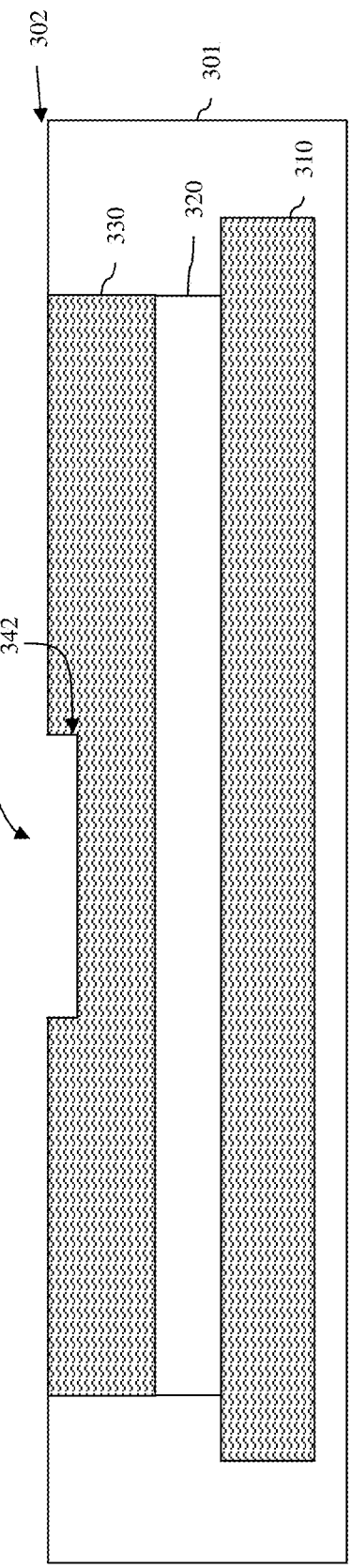
FIG. 14 is a cross-section view drawing illustrating a partially completed vertical JFET structure formed according to the method of FIG. 12.
Figure 15:
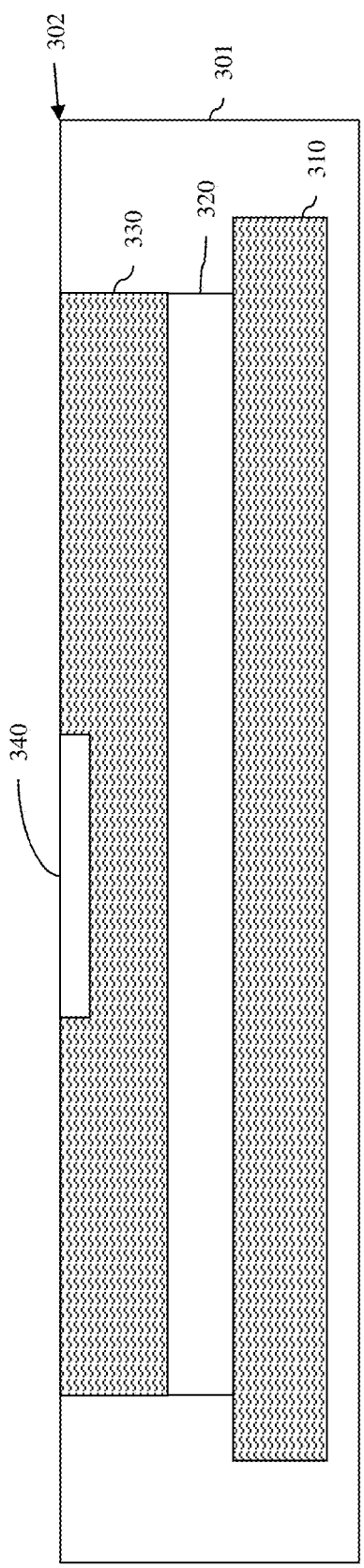
FIG. 15 is a cross-section view drawing illustrating a partially completed vertical JFET structure formed according to the method of FIG. 12.

After the N-type channel region 330 is formed at process 708, a second P-type gate 340 for the junction field effect transistor 300 can be formed by a trench 341 (e.g., using conventional lithographic patterning and etch techniques) that extends vertically from the top surface 302 of the substrate 301 to the second N-well such that the trench 341 has a bottom surface 342 that abuts the N-type channel region 330 and is above and is physically separated from the first P-type gate 320 (710, see FIG. 14). Then, the trench 341 can be filled (e.g., by epitaxial deposition) with a silicon germanium layer or a silicon germanium carbide layer, which is either in situ doped or subsequently implanted with a P-type dopant (712, see FIG. 15).

As described above, this method embodiment results in only the second P-type gate 340 of the JFET 300 comprising silicon germanium or silicon germanium carbide. Alternatively, the method can be performed such that the first P-type gate 320 comprises silicon germanium or silicon germanium carbide and the second P-type gate 340 comprises silicon, silicon germanium or silicon germanium carbide.

Figure 16:
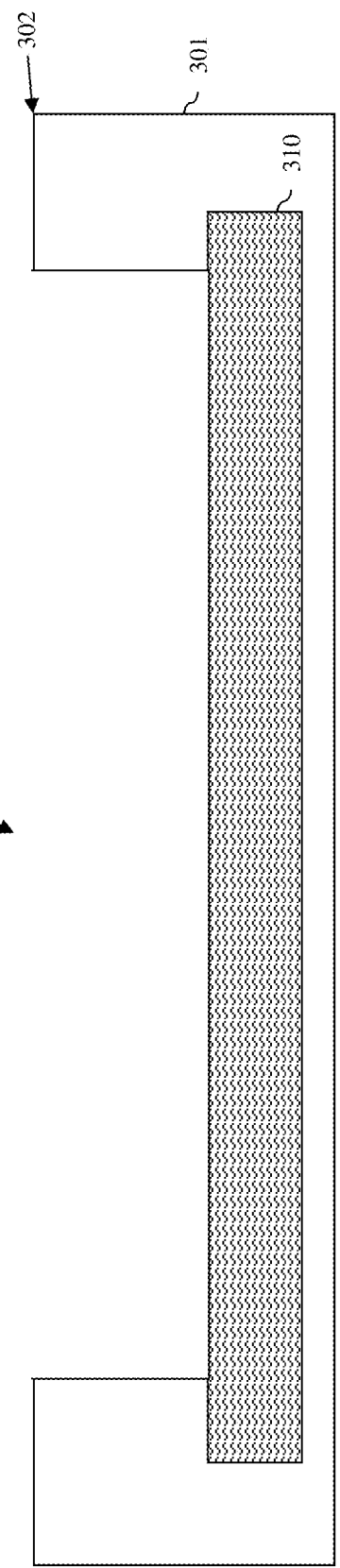
FIG. 16 is a cross-section view drawing illustrating a partially completed vertical JFET structure formed according to the method of FIG. 12.
Figure 17:
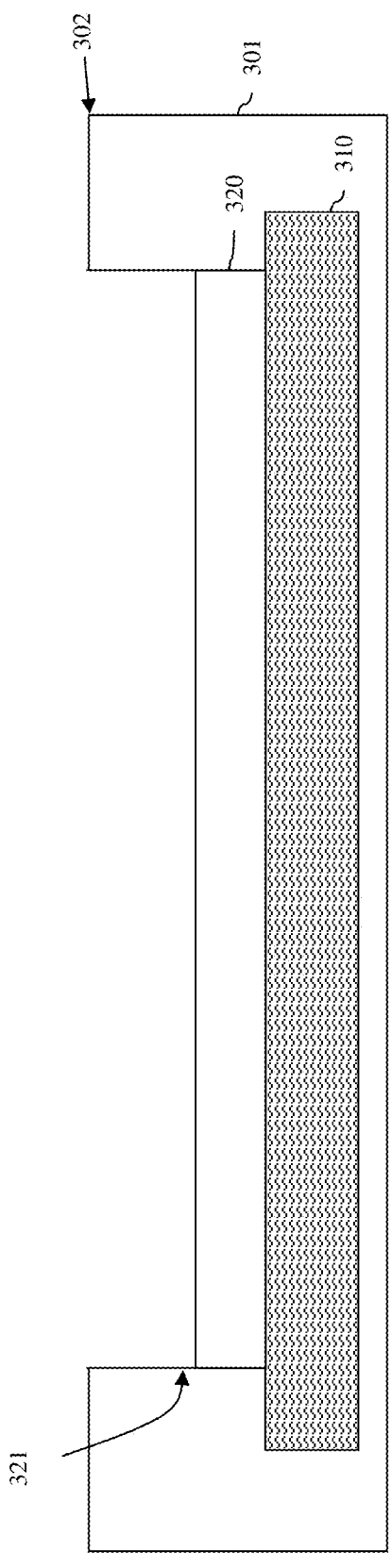
FIG. 17 is a cross-section view drawing illustrating a partially completed vertical JFET structure formed according to the method of FIG. 12.
Figure 18:
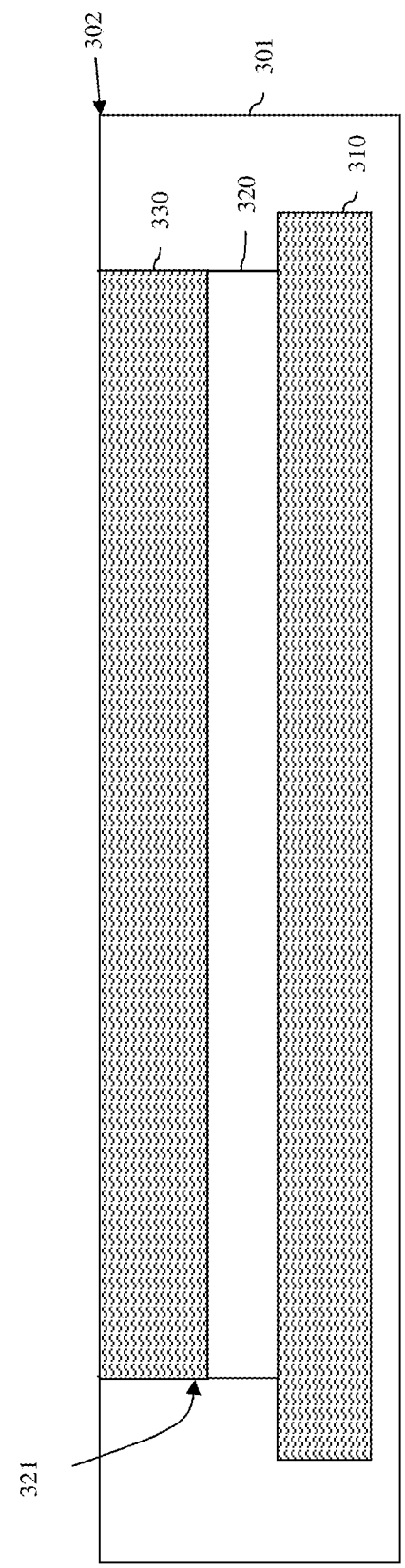
FIG. 18 is a cross-section view drawing illustrating a partially completed vertical JFET structure formed according to the method of FIG. 12.
Figure 19:
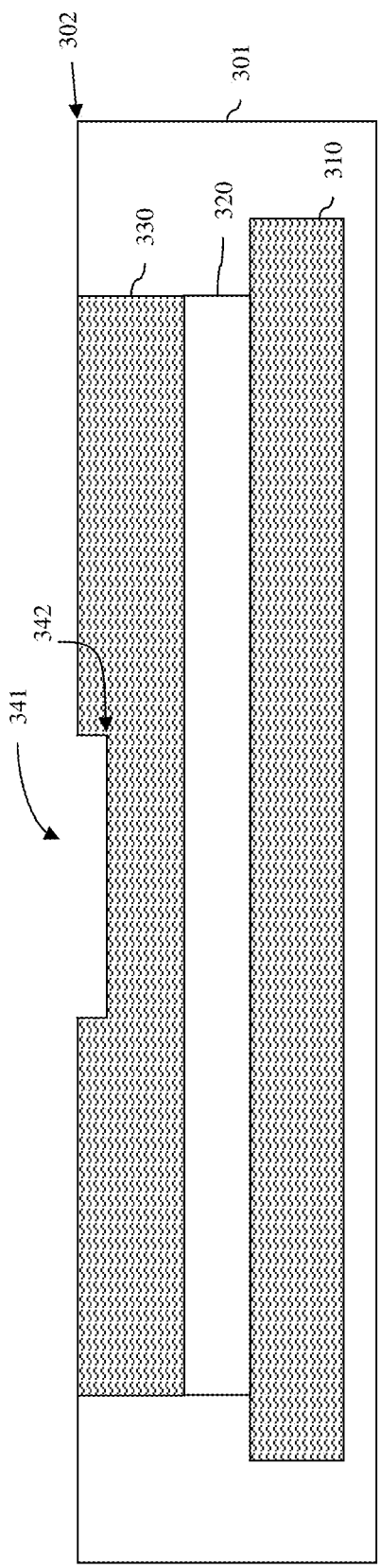
FIG. 19 is a cross-section view drawing illustrating a partially completed vertical JFET structure formed according to the method of FIG. 12.
Figure 20:
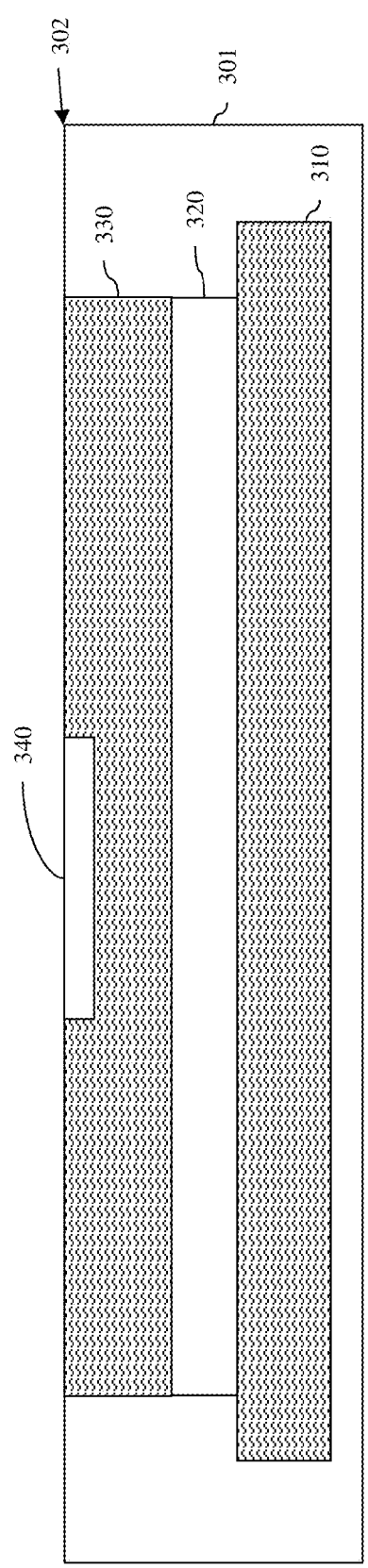
FIG. 20 is a cross-section view drawing illustrating a partially completed vertical JFET structure formed according to the method of FIG. 12.

Specifically, rather than forming the first P-type gate 320 by forming a P-well at process 706, the first P-type gate 320 can be formed by forming a first trench 321 (e.g., using conventional lithographic patterning and etch techniques) that extends vertically from the top surface 302 of the substrate 301 to the N-well 310 below (714, see FIG. 16). Then, a first P-type silicon germanium layer or a first P-type silicon germanium carbide layer can be formed in the lower portion of this first trench 321 (e.g., by epitaxial deposition with in-situ P-type doping) (716, see FIG. 17). In this case, the N-type channel region 330 can be formed by forming an N-type silicon layer in the first trench 321 on the first P-type gate 320 (e.g., by epitaxial deposition with in-situ N-type doping) (718, see FIG. 18). Then, the second P-type gate 340 can be formed by forming a second trench 341 (e.g., by conventional lithographic patterning and etch techniques) extending vertically to the N-type silicon layer such that it has a bottom surface 342 that abuts the N-type channel region 330 and is above and physically separated from the first P-type gate 320 (720, see FIG. 19). This second trench 341 can be filled (e.g., by epitaxial deposition) with a semiconductor layer, which is either in situ doped or subsequently implanted with a P-type dopant (722, see FIG. 20). Specifically, this second trench 341 can be filled with a silicon layer so that only the bottom gate (i.e., the first P-type gate 321) comprises silicon germanium or silicon germanium carbide. Alternatively, this second trench 341 can be filled with a second silicon germanium layer or a second silicon germanium carbide layer so that both the top and bottom gates (i.e., the first and second gates 320, 340) comprise silicon germanium or silicon germanium carbide.

In each of the method embodiments for forming a vertically JFET structure, N-type source/drain regions for the junction field effect transistor can be formed by forming N-type implant regions at the top surface of the substrate above and abutting the N-type channel region. These N-type implant regions can be formed so that they have a higher concentration of an N-type dopant than the N-type channel region and also so that the second P-type gate is positioned laterally between them. To isolate the second P-type gate from the N-type source/drain regions, isolation structures can be formed either before or after the N-type implant regions are formed.

Regardless of whether the first P-type gate 320, the second P-type gate 340 or both P-type gates 320, 340 are formed, as described above, so as to comprise silicon germanium or silicon germanium carbide, N-type source/drain regions 350 for the junction field effect transistor 300 can be formed by forming N-type implant regions (e.g., using a conventional masked ion implantation process) at the top surface 302 of the substrate 301 abutting opposing ends (i.e., the first end 333 and second end 334) of the N-type channel region 330 (724, see FIG. 3). These N-type implant regions can be formed so that they have a higher concentration of an N-type dopant than the N-type channel region 330 and also so that the second P-type gate 340 is positioned laterally between them. To isolate the second P-type gate 340 from the N-type source/drain regions 350, isolation structures 370 can be formed at any of various appropriate times during processing (e.g., prior to any dopant implantation processes, prior to formation of the N-type implant regions, after formation of the N-type implant regions, etc.) (728, see FIG. 3). Such trench isolation structures 370 can be formed so that they laterally surround each of the N-type implant regions 350 and so that they extend vertically into the N-type channel region 330 to a depth at or below the depth of the bottom surface 342 of the trench 341 for the adjacent P-type gate 340. Each trench isolation structure 370 can be formed using conventional shallow trench isolation (STI) formation techniques.

Additional processing steps can be performed in order to complete the JFET 300 structure (728, see FIG. 3). For example, contacts 315, 325 can be formed to the first P-type gate 320 and N-well 310, respectively, so as to allow the first P-type gate 320 and N-well 310 to be electrically biased.

To form the first contact 315, an additional P-well 316 can be formed (e.g., using a conventional masked ion implantation process) such that it extends vertically into the substrate 301 from the top surface 302 and such that it laterally abuts the first P-type gate 320 (i.e., is positioned laterally adjacent to and in physical contact with the first P-type gate). Optionally, this additional P-well 316 can be formed (e.g., using a multi-step ion implantation process) such that the upper portion 317 (i.e., a well contact region) at the top surface 302 of the substrate 301 has a higher concentration of P-type dopant than the portion of the additional P-well 316 below.

Similarly, to form the second contact 325, an additional N-well 326 can be formed (e.g., using a conventional masked ion implantation process) such that it extends vertically from the top surface 302 of the substrate 301 to the first N-well 310. Optionally, this additional N-well 326 can be formed (e.g., using a multi-step ion implantation process) such that the upper portion 327 (i.e., a well contact region) at the top surface 302 of the substrate 301 that has a higher concentration of N-type dopant than the portion of the additional N-well 326 below.

Such contacts 315, 325 can further be formed (i.e., patterned) so that they are annular with respect to the JFET 300, as shown in FIG. 4. That is, the first contact 315 can be formed so as to border the outer edges of the first P-type gate 320 and the second contact 325 can be formed so as to border the first contact 315. It should be noted that additional trench isolation structures 370 can be formed at process 726 so as to isolate the highly doped upper portion 317 of the first contact 315 from the highly doped upper portion 327 of the second contact 325. Optionally, the upper portion 317 of the first contact 315 can also be formed (i.e., patterned) such that it abuts (i.e., is in physical contact with) the second P-type gate 340, allowing the first and second P-type gates 320, 330 to be concurrently biased. Alternatively, the upper portion 317 of the first contact 315 can be formed (i.e., patterned) so that it is isolated (e.g., by another STI structure 370, not shown) from the second P-type gate 340, allowing the first and second P-type gates 320, 340 to be independently biased.

The exemplary techniques for forming the first and second contacts 315, 325, as described above, are offered for illustration purposes. It should be understood that various other vertical JFET contact formation techniques are well-known in the art and could alternatively be used. For example, the contacts 315, 215 could be formed as backside contacts, with different conductive materials, adjacent to only a portion of the JFET (as opposed to being annular with respect to the JFET structure), asymmetrically, etc.

It should be understood that the method embodiments, as described above, are to be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should further be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Additionally, the corresponding structures, materials, acts, and equivalents of all means or step plus function elements in the claims below are intended to include any structure, material, or act for performing the function in combination with other claimed elements as specifically claimed. The descriptions of the embodiments of the present invention have been presented for purposes of illustration and description, but are not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Therefore, disclosed above are embodiments of a junction field effect transistor (JFET) structure with one or more P-type silicon germanium (SiGe) or silicon germanium carbide (SiGeC) gates (i.e., a SiGe or SiGeC based heterojunction JFET). The P-type SiGe or SiGeC gate(s) allow for a lower pinch off voltage (i.e., lower Voff) without increasing the on resistance (Ron). Specifically, SiGe or SiGeC material in a P-type gate limits P-type dopant out diffusion and, thereby ensures that the P-type gate-to-N-type channel region junction is more clearly defined (i.e., abrupt as opposed to graded). By clearly defining this junction, the depletion layer in the N-type channel region is extended. Extending the depletion layer in turn allows for a faster pinch off (i.e., requires lower Voff). Ron is not impacted because it is typically dominated by the dopant in channel region and by side vertical resistors. P-type SiGe or SiGeC gate(s) can be incorporated into conventional lateral JFET structures and/or vertical JFET structures. Incorporating P-type SiGe or SiGeC gates into the JFET structure has essentially no impact on the on resistance (Ron) and may provide the added benefit of imparting a desired stress on the channel region to increase charge carrier mobility. Also disclosed herein are embodiments of a method of forming such a JFET structure.

What is claimed is:

1. A method of forming a junction field effect transistor, said method comprising:
    forming, in a semiconductor layer comprising a first semiconductor material, N-type source/drain regions and an N-type channel region, said N-type source/drain regions being adjacent to a first end of said N-type channel region and a second end of said N-type channel region opposite said first end; and,
    forming a first P-type gate adjacent to a first side of said N-type channel region and a second P-type gate adjacent to a second side of said N-type channel region opposite said first gate such that at least one of said first P-type gate and said second P-type gate comprises a second semiconductor material different from said first semiconductor material so as to limit P-type dopant outdiffusion into said N-type channel region.

2. The method of claim 1, said first semiconductor material comprising silicon and said second semiconductor material comprising any of silicon germanium and silicon germanium carbide.

3. The method of claim 1, said first P-type gate and said second P-type gate being formed such that only said first P-type gate comprises said second semiconductor material.

4. The method of claim 1, further comprising providing wafer comprising a substrate, an insulator layer on said substrate and said semiconductor layer on said insulator layer, said semiconductor layer comprising an N-type semiconductor layer and said forming of said N-type source/drain regions comprising forming N-type implant regions in said N-type semiconductor layer such that said N-type implant regions are separated by a designated portion of said N-type semiconductor layer comprising said N-type channel region.

5. The method of claim 4, said forming of said N-type implant regions ensuring that said N-type source/drain regions have a higher concentration of an N-type dopant than said N-type channel region.

6. The method of claim 1, said forming of said first P-type gate and said second P-type gate comprising:
   forming, in said semiconductor layer, a first trench positioned laterally adjacent to said first side of said N-type channel region and a second trench positioned laterally adjacent to said second side of said N-type channel region; and
   filling said first trench and said second trench with any one of a silicon germanium layer and a silicon germanium carbide layer so as to form said first P-type gate and said second P-type gate, respectively.

7. The method of claim 1, said forming of said first P-type gate and said second P-type gate comprising:
   forming, in said semiconductor layer, a trench positioned laterally adjacent to said first side of said N-type channel region;
   filling said trench with any one of a silicon germanium layer and a silicon germanium carbide layer to form said first P-type gate; and,
   forming, in said semiconductor layer, a P-type implant region adjacent to said second side of said N-type channel region.

8. A method of forming a junction field effect transistor, said method comprising:
   providing a silicon substrate having a top surface;
   forming a first N-well in said substrate;
   forming a first P-type gate for said junction field effect transistor, said forming of said first P-type gate comprising forming a P-well in said substrate above and abutting said first N-well;
   forming an N-type channel region for said junction field effect transistor, said forming of said N-type channel region comprising forming a second N-well in said substrate above and abutting said P-well; and
   forming a second P-type gate for said junction field effect transistor, said forming of said second P-type gate comprising:
      forming a trench that extends vertically from said top surface of said substrate to said second N-well, said trench having a bottom surface that abuts said N-type channel region and is above and physically separated from said first P-type gate; and
      filling said trench with any one of a silicon germanium layer and a silicon germanium carbide layer.

9. The method of claim 8, said filling of said trench comprising performing an epitaxial deposition process.

10. The method of claim 9, said forming of said second P-type gate further comprising any one of in-situ doping and subsequently doping said one of said silicon germanium layer and said silicon germanium carbide layer with a P-type dopant.

11. The method of claim 8, said first N-well, said P-well and said second N-well being formed using ion implantation processes with different ion implantation energies so that said P-well is above said first N-well and said second N-well is above said P-well.

12. The method of claim 8, further comprising,
   forming N-type source/drain regions for said junction field effect transistor, said forming of said N-type source/drain regions comprising forming N-type implant regions at said top surface of said substrate, said N-type implant regions being formed so as to abut said N-type channel region, so as to have a higher concentration of an N-type dopant than said N-type channel region and so that said second P-type gate is positioned laterally between said N-type implant regions; and
   forming isolation structures so that said N-type source/drain regions are isolated from said second P-type gate.

13. The method of claim 8, further comprising:
   forming a first contact extending vertically from said top surface to said first P-type gate; and
   forming a second contact extending vertically from said top surface to said first N-well.

14. The method of claim 13, said first contact being formed so as to be electrically connected to said second P-type gate.

15. A method of forming a junction field effect transistor, said method comprising: comprising:
   providing a silicon substrate having a top surface;
   forming an N-well in said substrate below said top surface;
   forming a first trench that extends vertically from said top surface into said N-well;
   forming a first P-type gate for said junction field effect transistor, said forming of said first P-type gate comprising forming any one of a first P-type silicon germanium layer and a first P-type silicon germanium carbide layer in a lower portion of said first trench;
   forming an N-type channel region for said junction field effect transistor, said forming of said N-type channel region comprising forming an N-type silicon layer in said first trench on said first P-type gate; and
   forming a second P-type gate for said junction filed effect transistor, said forming of said P-type gate comprising:
      forming a second trench extending vertically to said N-type silicon layer, said second trench having a bottom surface that abuts said N-type channel region and is above and physically separated from said first P-type gate; and
      filling said second trench with a semiconductor layer.

16. The method of claim 15, said filling of said second trench comprising filling said second trench with any one of a silicon layer, a second silicon germanium layer and a second silicon germanium carbide layer.

17. The method of claim 15, said filling of said second trench comprising filling said second trench with any one of a silicon layer, a second silicon germanium layer and a second silicon germanium carbide layer.

18. The method of claim 15, further comprising:
   forming N-type source/drain regions for said junction field effect transistor, said forming of said N-type source/drain regions comprising forming N-type implant regions at said top surface of said substrate, said N-type implant regions being formed so as to abut said N-type channel region, so as to have a higher concentration of an N-type dopant than said N-type channel region and so that said second P-type gate is positioned laterally between said N-type implant regions; and forming isolation structures so that said N-type source/drain regions are isolated from said second P-type gate.

19. The method of claim 15, further comprising:

forming a first contact extending vertically from said top surface to said first P-type gate; and forming a second contact extending vertically from said top surface to said N-well.

20. The method of claim 19, said first contact being formed so as to be electrically connected to said second P-type gate.

* * * * *